(12) United States Patent
Weaver et al.

(10) Patent No.: US 6,608,432 B2
(45) Date of Patent: Aug. 19, 2003

(54) CATHODE TARGET MOUNTING FOR CATHODIC ARC CATHODES

(75) Inventors: Scott Andrew Weaver, Ballston Lake, NY (US); Don Mark Lipkin, Niskayuna, NY (US); Reed Roeder Corderman, Niskayuna, NY (US); Terry Clifford Cooper, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 143 days.

(21) Appl. No.: 09/825,126

(22) Filed: Apr. 3, 2001

(65) Prior Publication Data

US 2002/0140334 A1 Oct. 3, 2002

(51) Int. Cl.$^7$ .......................... H01J 17/26; H01J 61/28
(52) U.S. Cl. ............................ 313/231.41; 313/231.01; 315/111.81
(58) Field of Search .................. 313/231.01, 231.41; 315/111.21, 111.41, 111.71, 111.91, 111.81; 204/298.41, 298.15, 298.23, 192.38; 118/723; 427/580, 39

(56) References Cited

U.S. PATENT DOCUMENTS

| | | | | | |
|---|---|---|---|---|---|
| 3,848,153 A | * | 11/1974 | Quintal et al. | ............... | 313/346 |
| 5,007,373 A | * | 4/1991 | Legg et al. | ................. | 118/723 |
| 5,965,278 A | * | 10/1999 | Finley et al. | ................ | 428/641 |
| 6,103,074 A | * | 8/2000 | Khominich | ............ | 204/192.38 |

* cited by examiner

Primary Examiner—Nimeshkumar D. Patel
Assistant Examiner—Jason Phinney
(74) Attorney, Agent, or Firm—Robert P. Santandrea; Noreen C. Johnson

(57) ABSTRACT

An apparatus for cathodic arc coating. The apparatus includes: a vacuum chamber which includes an anode; a power supply; and a cathode target assembly connected to the power supply. The cathode target assembly includes a cathode target and a target holder. In the preferred embodiment, a conductive interlayer is located between the cathode target and the target holder, and a cooling block is in contact with the cathode target.

41 Claims, 7 Drawing Sheets

CATHODE TARGET MOUNTING FOR CATHODIC ARC CATHODES

BACKGROUND OF THE INVENTION

The present invention relates generally to cathodic arc coating and, more particularly, to an improved target mounting system for cathodic arc cathodes.

The cathodic arc process is known in the art as a robust, relatively inexpensive technique for deposition of single and multi-component metallic and nonmetallic coatings. Cathodic arc deposition systems consist of a vacuum chamber which includes an anode, a power supply and a cathode. The cathode material is deposited during the operation of the system.

Often, these cathodes are typically mounted to the electrical source and means for cooling the cathode by means of a threaded stud. In some instances, cost and/or manufacturability considerations preclude making the entire cathode from the material of interest.

Thus, there remains a need for an improved cathodic arc coating apparatus able to mount less than a complete cathode target while, at the same time, providing sufficient strength to hold the cathode in place.

SUMMARY OF THE INVENTION

The present invention is directed to an apparatus for cathodic arc coating. The apparatus includes: a vacuum chamber which includes an anode; a power supply; and a cathode target assembly connected to the power supply. The cathode target assembly includes a cathode target and a target holder. In a preferred embodiment of the invention, an electrically conductive interlayer is located between the target and the target holder; and a cooling block in contact with the cathode target.

The cooling block includes a chamber adjacent to the cathode and a cooling fluid supply contained within the chamber. A fluid seal between the cooling block and the cathode prevents leakage of coolant into the vacuum chamber. The cooling fluid supply includes an inlet for providing cooling fluid into the chamber and an exit for withdrawing the fluid from the chamber.

The vacuum chamber includes an enclosed chamber and a staged pump for producing a vacuum therein. In the preferred embodiment, the power supply is a continuous DC power supply of greater than about 60 amps at about 20 volts.

In the preferred embodiment, the conductive interlayer is a layer of in situ solder such as a low melting point metal like indium. However, the conductive interlayer may be a sheet of metal foil formed from a ductile metal such as gold, silver or platinum.

Also, in the preferred embodiment, the target is puck-shaped and the target holder is cup-shaped for receiving the puck-shaped target. Pins may extend through the walls of the cup-shaped holder into the puck-shaped target to attach the target to the target holder.

In a second embodiment, the puck-shaped target further includes a shoulder portion, which extends beyond the base of the target and, wherein the shoulder of the target and the walls of the cup-shaped target holder are substantially co-extensive.

In a third embodiment, the shoulder of the puck-shaped target extends beyond the walls of the cup-shaped holder to form a mushroom shape.

Accordingly, one aspect of the present invention is to provide an apparatus for cathodic arc coating. The apparatus includes: a vacuum chamber which includes an anode; a power supply; and a cathode target assembly connected to the power supply, the assembly including: a cathode target and a target holder.

Another aspect of the present invention is to provide a mounted cathode assembly for a cathodic arc coating apparatus. The cathode target assembly includes: a target holder; a cathode target disposed within the target holder; and a conductive interlayer located between the target and the target holder.

Still another aspect of the present invention is to provide an apparatus for cathodic arc coating. The apparatus includes: a vacuum chamber which includes an anode; a power supply; a cathode target assembly connected to the power supply, the assembly including: a cathode target; a target holder; and a conductive interlayer located between the target and the target holder; and a cooling block in contact with the cathode target.

These and other aspects of the present invention will become apparent to those skilled in the art after a reading of the following description of the preferred embodiment when considered with the drawings.

DETAILED DESCRIPTION

Figure 1:
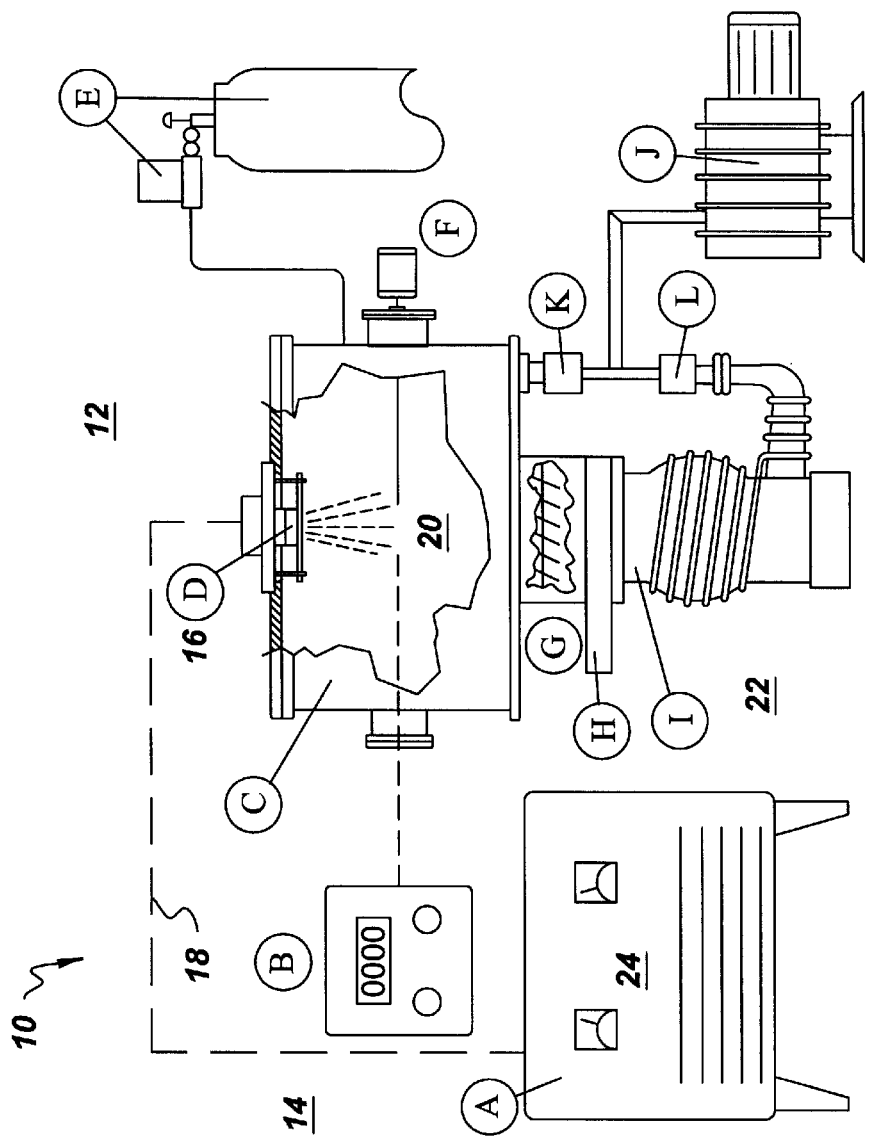
FIG. 1 is a schematic representation of a cathodic arc coating apparatus constructed according to the present invention.

In the following description, like reference characters designate like or corresponding parts throughout the several views. Also in the following description, it is to be understood that such terms as "forward," "rearward," "left," "right," "upwardly," "downwardly," and the like are words of convenience and are not to be construed as limiting terms.

Turning to the figures in general, and FIG. 1 in particular, there is shown a cathodic arc coating apparatus, generally designated 10, constructed according to the present invention. The apparatus includes three primary assemblies: a vacuum system 12 which includes an anode; a power supply 14; and a mounted cathode assembly 16.

The vacuum system 12 includes an enclosed chamber 20 and a staged pump system 22 for removing the atmosphere from the enclosed chamber 20. In the preferred embodiment, the power supply 14 is a DC power supply 24, such as a Model MA200 including a restart circuit available from Ion Bond of Madison Heights, Mich. In one embodiment of the invention, the power supply 14 is a continuous DC power supply capable of producing greater than 60 amps at about 20 volts for a total power output greater than about 1200 watts at a 100% duty cycle.

As in conventional cathodic arc coating systems, a bias voltage is connected to the parts to be coated through the chamber wall. The parts may be rotated by means of a planetary drive motor to ensure uniform coating of the parts. The vacuum chamber staged pump system 22 is also of generally conventional design, including a throttle valve and gate valve to allow the chamber 20 to be isolated from a diffusion pump and a rough pump downstream from of the diffusion pump. A chamber rough valve and a foreline valve allow the chamber to be evacuated before the diffusion pump is engaged. A process gas supply may also be used to partially backfill the chamber with an inert or selectively reactive gas.

Figure 2:
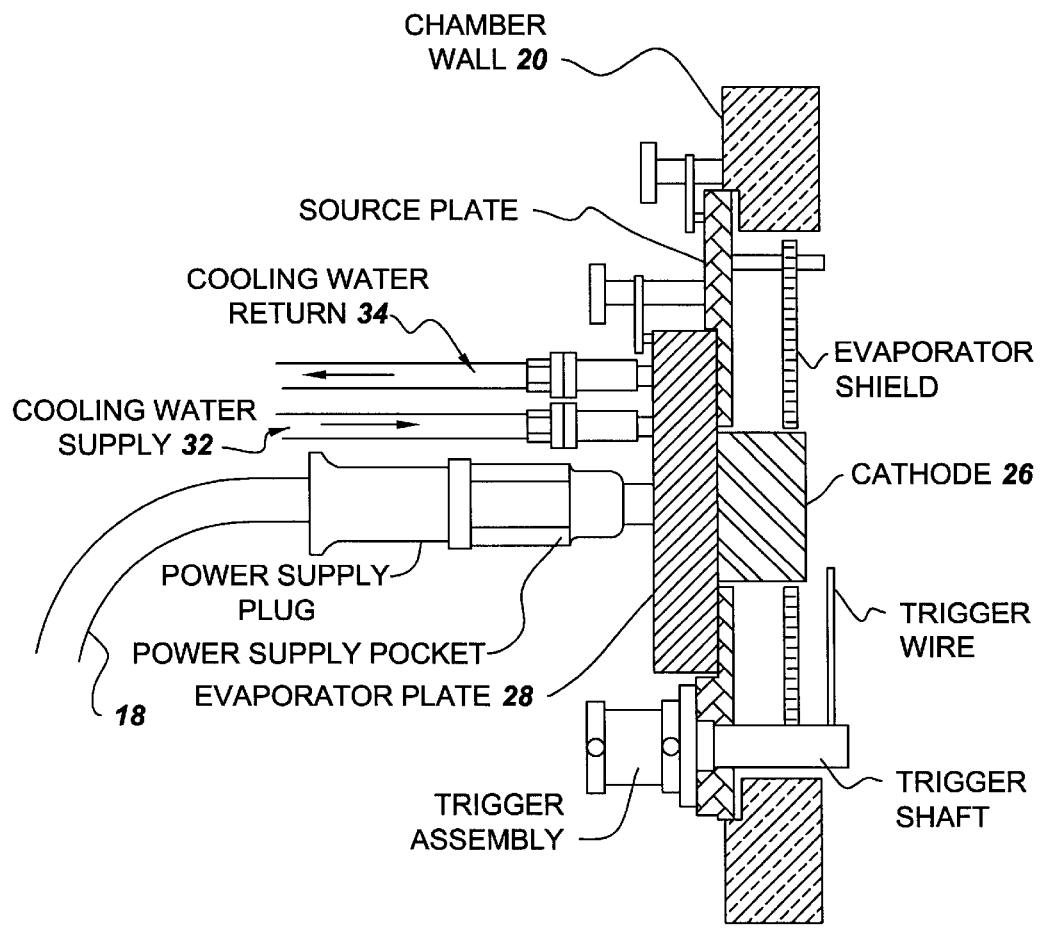
FIG. 2 is an enlarged cross-sectional view of the cathode assembly shown in FIG. 1.

FIG. 2 shows an enlarged cross-sectional view of the cathode assembly 16 shown in FIG. 1. As can be seen, the target cathode 26 is attached to a cooling block 28 through which power from the power supply 14 is fed into the cathode target 26. In addition, in the preferred embodiment, the cooling block 28 has a supply of cooling fluid, such as water, through inlet 32, which then returns the cooling water through outlet 34. This entire assembly is attached to the top wall of chamber 20.

Figure 3:
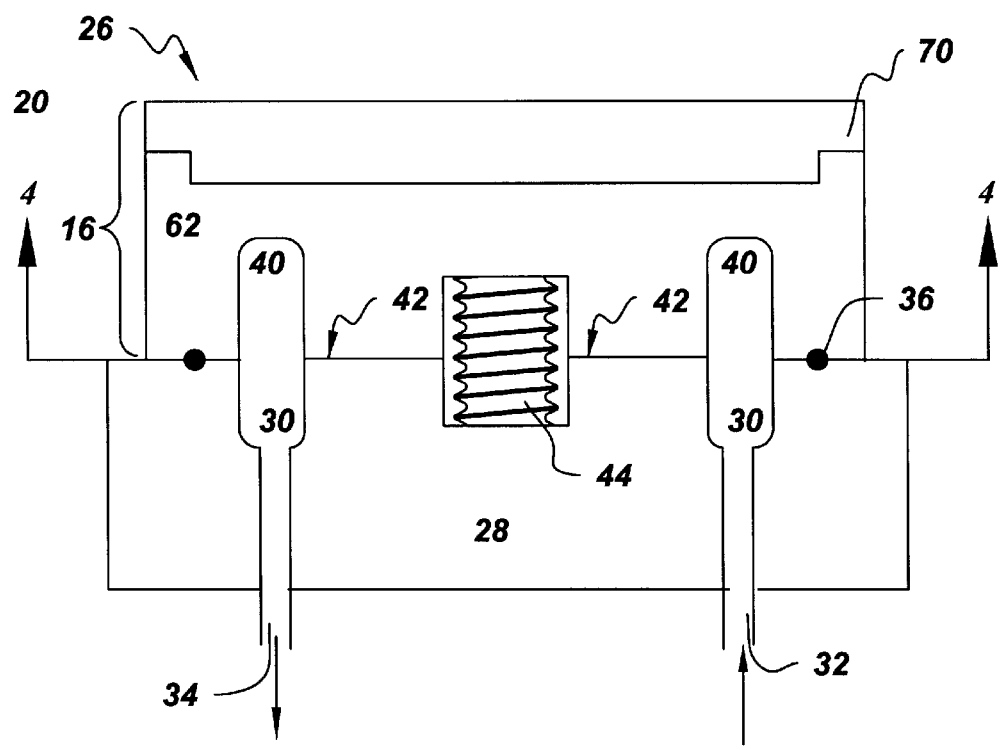
FIG. 3 is a cross-sectional schematic view of the cooling block sub-assembly of the present invention.

The preferred embodiment of the present invention can best be seen in FIG. 3, which is a cross-sectional schematic view of the cooling block 28 and the mounted cathode assembly 26. Because cathodic arc deposition is used to apply a coating that is intended to improve the wear or abrasion resistance of the underlying work piece, it will be readily appreciated that many useful target materials are inherently difficult to machine. In addition, other target materials are initially very costly to produce, even the sample sizes suitable for deposition. Accordingly, it is very important to be able to mount smaller than normally acceptable sizes of the target cathode with the minimum amount of machining.

In the preferred embodiment, a conventional cooling block 28 is used in contact with the mounted cathode 26. This cooling block includes a fluid chamber 30 adjacent to the back wall of the cathode 26 for receiving the cooling fluid supply. In the preferred embodiment, the coolant is water, which is fed through inlet 32 and out of exit 34. However, in some situations, a molten salt, gas, or any other material having a similar high heat capacity or high thermal conductivity could be used within the chamber.

When a liquid such as water is used, it is important that a seal, such as O-ring 36, be located between the fluid chamber 30 and vacuum chamber 20 to prevent the cooling fluid from flash vaporizing into the vacuum chamber 20, which could compromise the quality of the coating and may result in destruction of the downstream diffusion pump.

In the present invention, the chambers from the cooling block are preferably extending into the portion of the cathode assembly along a channeled chamber 40, which is coextensive along with the chamber 30 in the cooling block 28. As can be seen, this results in a substantial increase in the surface area where the cooling fluid is contact with the cathode target 26. Such an increase in cooling capacity allows a significant amount of energy, up to at least than 1200 watts, to be added to the target 26. However, in order to be able to absorb this amount of power and to conduct it to the target, a portion 42 of the cathode target 26 is left as a conductor. In the preferred embodiment, a stud 44 is attached to one of the cooling block 28 and the cathode target 26. The stud 44 allows the cathode target 26 to be securely attached to the cooling block 28 and improves conduction of both heat and power.

Figure 4:
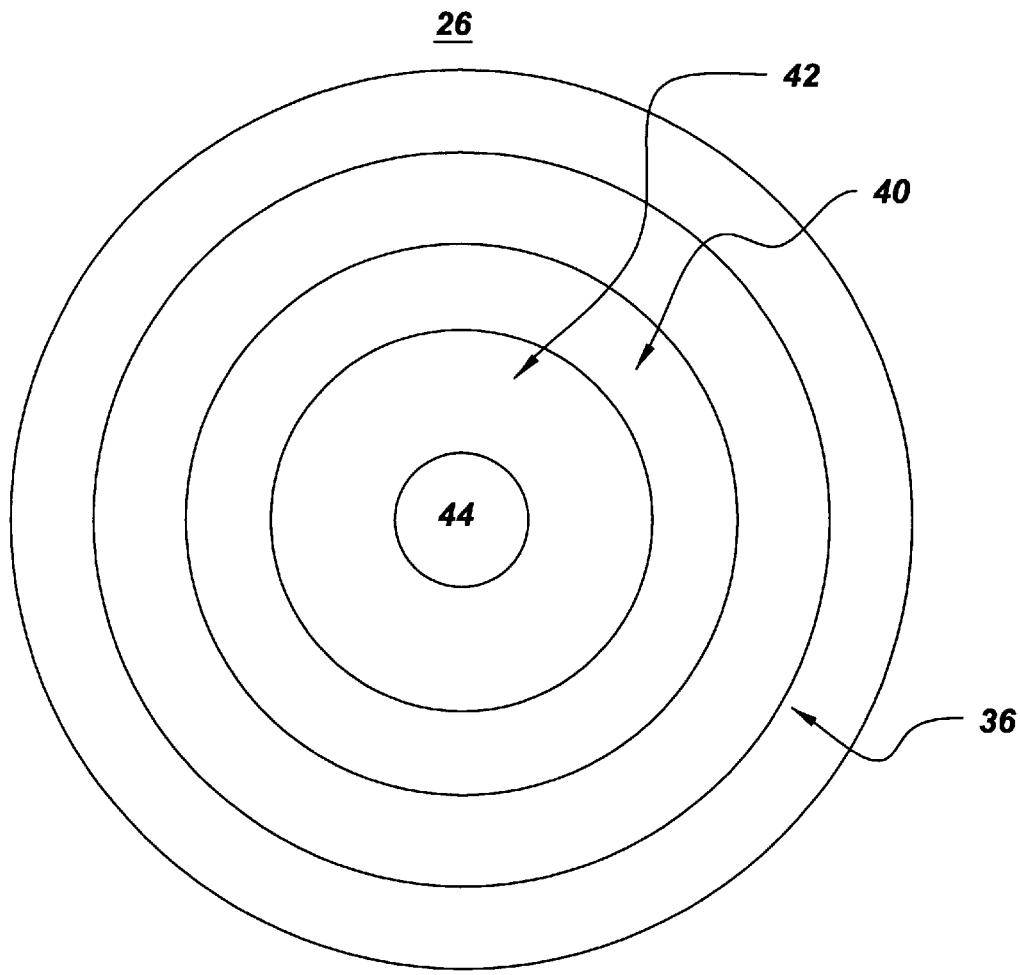
FIG. 4 is a cross-sectional view of the cathode assembly shown in FIG. 3 taken along lines 4—4.

As best seen in FIG. 4, because of the annular and symmetrical arrangement about the center conductor 42 and the stud 44 in the preferred embodiment, the cathode target 26 does not have to be set to just one position but can be tightened to whatever location is necessary without resulting in potentially catastrophic leakage of the cooling fluid into the chamber 20.

Figure 5:
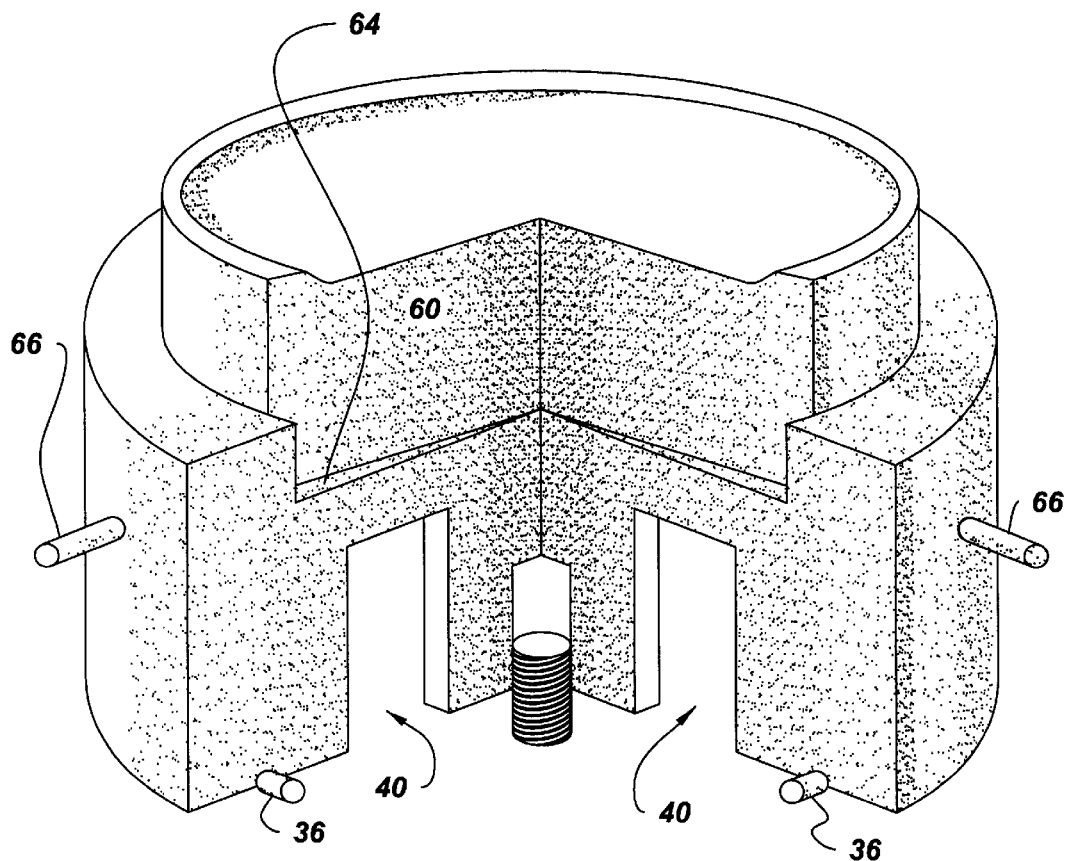
FIG. 5 is a perspective view of a first embodiment of a mounted cathode assembly of the present invention with a quarter section removed for illustration purposes.

A perspective view of a first embodiment of the mounted cathode assembly of the present invention is shown in FIG. 5. This embodiment is particularly useful when the target 60 is relatively small, as is in the case of targets of limited sample size. As can be seen, a puck-shaped target 60 fits within a cup-shaped holder 62, which in turn is attached to the cooling block 28, as previously described.

In this embodiment, a conductive interlayer 64 is formed between the adjacent surfaces of the target 60 and the bottom of cup-shaped holder 62. In the preferred embodiment, this conductive interlayer 64 is soldered in situ, using a low melting metal such as indium. As long as the melting point of the metal is significantly greater than the operating temperature of the cathode during the coating process, the metal will not re-melt during the coating process. Because of the temperature of use, however, the conductive interlayer could, in some cases, be formed from a foil of a ductile metal, such as gold, silver, or platinum. Also, pins 66 may be set through the walls of the cup-shaped holder and engage the outer surface of the puck-shaped target to hold it in place for added safety and security.

Figure 6:
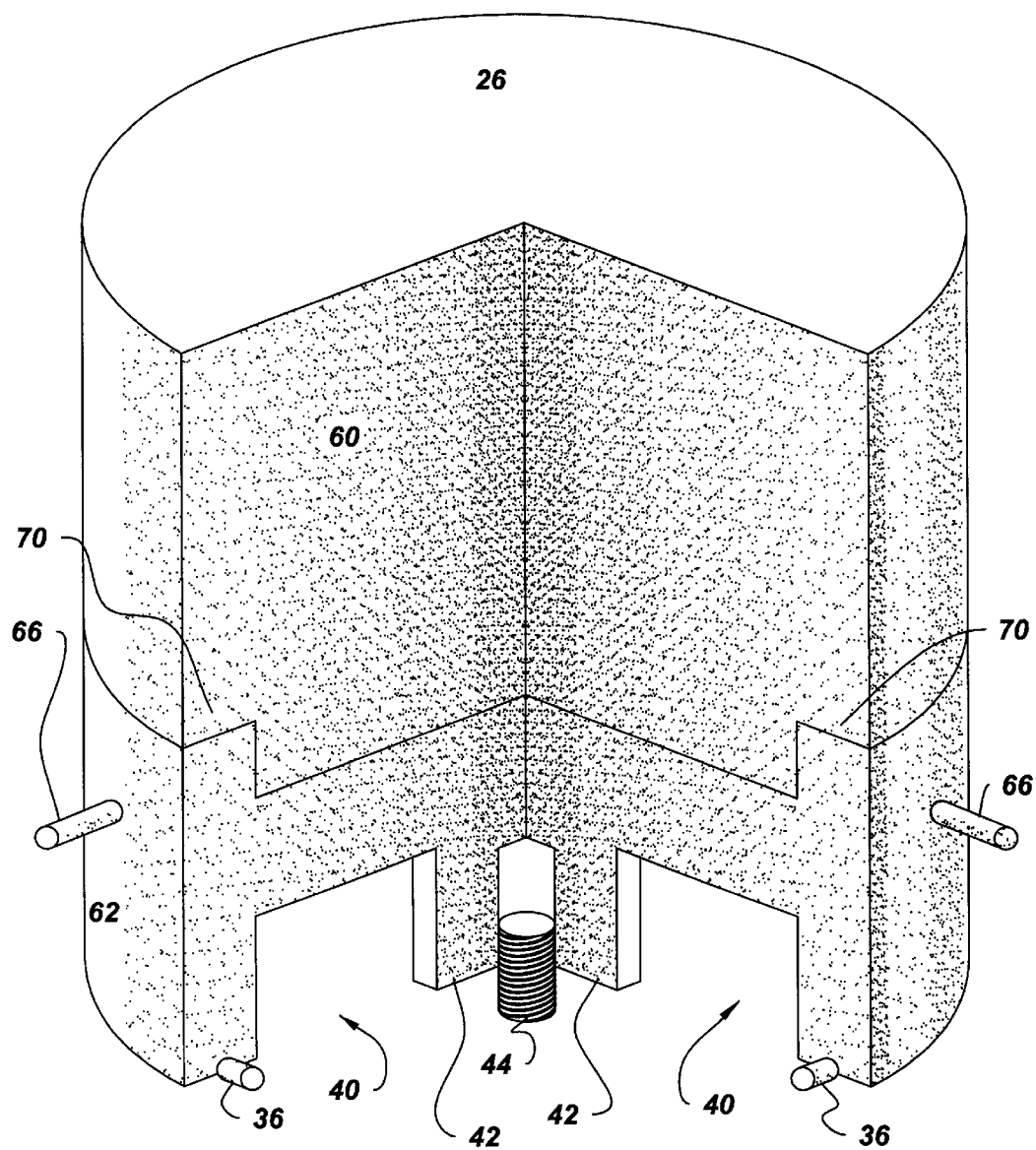
FIG. 6 is a perspective view of a second embodiment of a mounted cathode assembly of the present invention with a quarter section removed for illustration purposes.

As best seen in FIG. 6, in cases where larger targets are available but are formed from materials that are difficult to machine, the outer walls of the puck-shaped target 60 may be extended outwardly to form a shoulder 70. In this embodiment, the outer surface of the target 60 and the target holder 62 are generally coextensive. Again, pins and/or foil or solder may be utilized for added security or improved conductivity, as needed.

Figure 7:
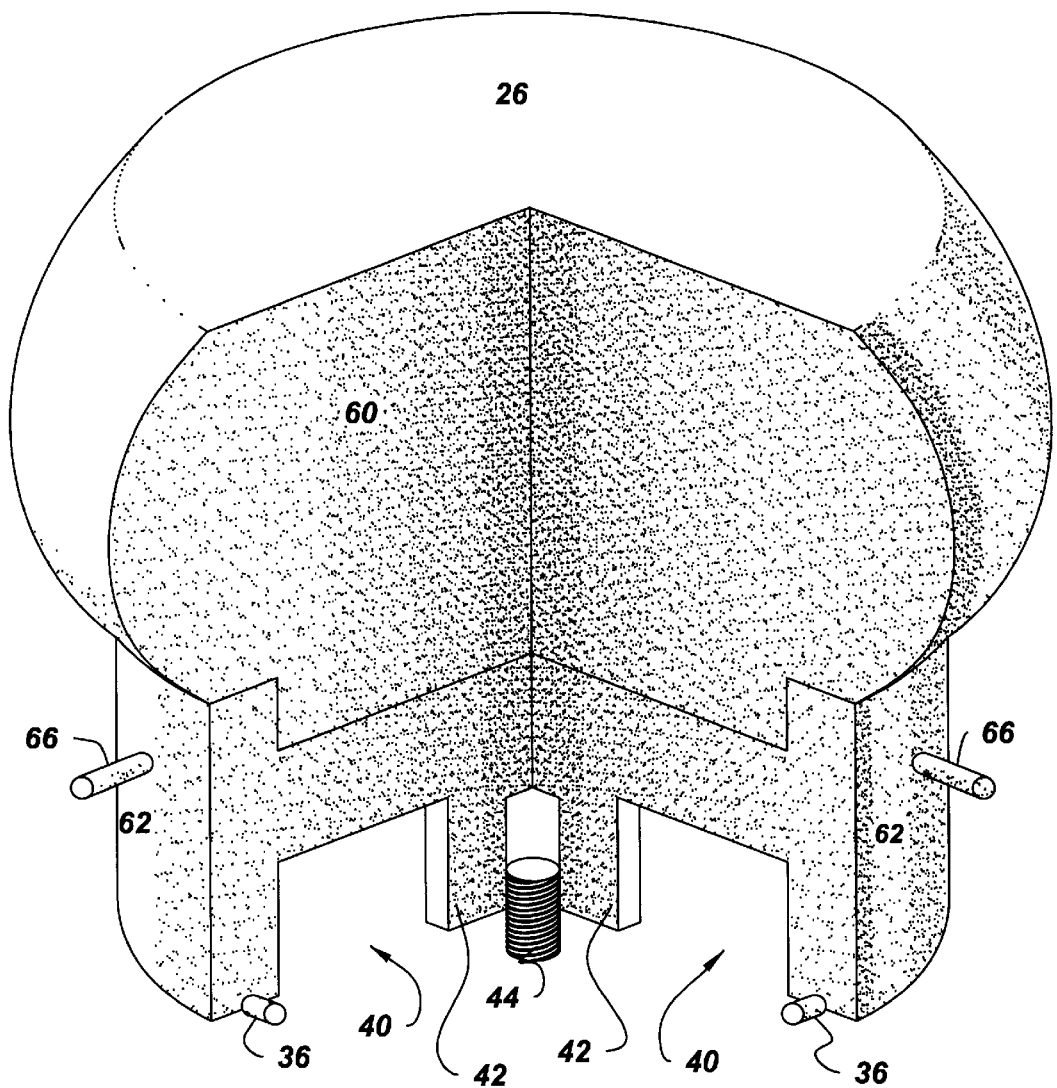
FIG. 7 is a perspective view of a third embodiment of a mounted cathode assembly of the present invention with a quarter section removed for illustration purposes.

A third embodiment, in which the shoulder 70 of the target 60 extends still further than the walls of the cup-shaped holder 62, is shown in FIG. 7. This results in a mushroom-shaped target, which can be particularly useful for some unique materials.

Certain modifications and improvements will occur to those skilled in the art upon a reading of the foregoing description. It should be understood that all such modifications and improvements have been deleted herein for the sake of conciseness and readability but are properly within the scope of the following claims.

What is claimed is:

1. An apparatus for cathodic arc coating, said apparatus comprising:
    (a) a vacuum chamber which includes an anode;
    (b) a power supply;
    (c) a cathode target assembly connected to said power supply, said assembly including: (i) a cathode target; and (ii) a target holder and
    (d) a solid cooling block in contact with a portion of a rear wall of said target holder.

2. The apparatus according to claim 1, wherein said cooling block includes a chamber adjacent to said cathode target and a cooling fluid supply contained within said chamber.

3. The apparatus according to claim 2, further including a fluid seal between said cooling block and said cathode target assembly.

4. The apparatus according to claim 2, wherein said cooling fluid supply is water.

5. The apparatus according to claim 2, wherein said cooling block includes an inlet for providing cooling fluid into said chamber and an exit for withdrawing the fluid from said chamber.

6. The apparatus according to claim 1, wherein said vacuum chamber includes an enclosed chamber and a staged pump for producing a vacuum therein.

7. The apparatus according to claim 1, wherein said power supply is a DC power supply.

8. The apparatus according to claim 7, wherein said DC power supply is a continuous DC power supply.

9. The apparatus according to claim 8, wherein said continuous DC power supply is capable f operating at a DC voltage of about 20 volts.

10. The apparatus according to claim 9, wherein said continuous DC power supply is capable of producing at least about 60 amps.

11. The apparatus according to claim 8, wherein said DC power supply has a total output of at least 1200 Watts.

12. A mounted cathode assembly for a cathodic arc coating apparatus, said mounted cathode assembly comprising:
(a) a target holder;
(b) a cathode target disposed in said target holder; and
a conductive interlayer located between said cathode target and said target holder, wherein said conductive interlayer is a sheet of metal foil.

13. The mounted cathode assembly according to claim 12, wherein said metal foil is f rated from a ductile metal.

14. The mounted cathode assembly according to claim 12, wherein said cathode target is a puck-shaped target, and wherein said target holder is a cup-shaped target holder having walls for receiving said puck-shaped target therein.

15. The mounted cathode assembly according to claim 14, further including at least one pin extending through the walls of said cup-shaped target holder into said puck-shaped target.

16. The mounted cathode assembly according to claim 14, wherein said puck-shaped target further includes a shoulder portion and a base, wherein said shoulder portion extends beyond said base of said puck-shaped target.

17. The mounted cathode assembly according to claim 16, wherein said shoulder portion of said puck-shaped target and said walls of said cup-shaped target holder are substantially co-extensive.

18. The mounted cathode assembly according to claim 16, wherein said shoulder portion of said puck-shaped target extends beyond said walls of said cup-shaped holder to form a mushroom shape.

19. The apparatus according to claim 13, wherein said ductile metal is one of gold, silver, platinum, and combinations thereof.

20. An apparatus for cathodic arc coating, said apparatus comprising:
(a) a vacuum chamber which includes an anode;
(b) a power supply;
(c) a mounted cathode assembly connected to said power supply, said mounted cathode assembly including: (I) a target holder; (ii) a cathode target disposed in said target holder; and (iii) conductive interlayer located between said cathode target and said target holder, and
(d) a solid cooling block in contact with a portion of a rear wall of said target holder.

21. The apparatus according to claim 20, wherein said cooling block includes a chamber adjacent to said mounted cathode assembly and a cooling fluid supply contained within said chamber.

22. The apparatus according to claim 21, further including a fluid seal between said cooling block and said mounted cathode assembly.

23. The apparatus according to claim 21, wherein said cooling fluid supply is water.

24. The apparatus according to claim 21, wherein said cooling block includes an inlet for providing cooling fluid into said chamber and an exit for withdrawing the fluid from said chamber.

25. The apparatus according to claim 20, wherein said vacuum chamber includes an enclosed chamber and a staged pump for producing a vacuum therein.

26. The apparatus according to claim 20, wherein said power supply is a DC power supply.

27. The apparatus according to claim 26, wherein said DC power supply is a continuous DC power supply.

28. The apparatus according to claim 27, wherein said continuous DC power supply is capable of operating at a DC voltage of about 20 volts.

29. The apparatus according to claim 28, wherein said continuous DC power supply is capable of providing at least about 60 amps.

30. The apparatus according to claim 27, wherein said DC power supply has a total output of at least 1200 Watts.

31. The apparatus according to claim 20, wherein said conductive interlayer is a layer of in situ solder.

32. The apparatus according to claim 31, wherein said in situ solder is a low melting point metal.

33. The apparatus according to claim 32, wherein said low melting point metal is indium.

34. The apparatus according to claim 20, wherein said conductive interlayer is a sheet of metal foil.

35. The apparatus according to claim 34, wherein said metal foil is formed from a ductile metal.

36. The apparatus according to claim 20, wherein said cathode target is a puck-shaped target, and wherein said target holder is cup-shaped target holder having walls for receiving said puck-shaped target therein.

37. The apparatus according to claim 36, further including at least one pin extending through the walls of said cup-shaped holder into said puck-shaped target.

38. The apparatus according to claim 36, wherein said puck-shaped target further includes a shoulder portion and a base, wherein said shoulder portion extends beyond said base of said puck-shaped target.

39. The apparatus according to claim 38, wherein said shoulder portion of said puck-shaped target and said walls of said cup-shaped target holder are substantially co-extensive.

40. The apparatus according to claim 38, wherein said shoulder portion of said puck-shaped target extends beyond said walls of said cup-shaped holder to form a mushroom shape.

41. The apparatus according to claim 35, wherein said ductile metal is one of gold, silver, platinum, and combinations thereof.

* * * * *